United States Patent
Lyon

(10) Patent No.: US 9,962,921 B1
(45) Date of Patent: May 8, 2018

(54) TECHNIQUES FOR PRINTING 3D SHIPPING CONTAINERS

(71) Applicant: Amazon Technologies, Inc., Seattle, WA (US)

(72) Inventor: Derek Avery Lyon, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 434 days.

(21) Appl. No.: 14/574,241

(22) Filed: Dec. 17, 2014

(51) Int. Cl.
*B33Y 50/02* (2015.01)
*B29C 64/393* (2017.01)
*G06F 17/50* (2006.01)
*G05B 15/02* (2006.01)

(52) U.S. Cl.
CPC .............. *B33Y 50/02* (2014.12); *G05B 15/02* (2013.01); *G06F 17/50* (2013.01); *B29C 64/393* (2017.08)

(58) Field of Classification Search
CPC ......... G05F 17/60; G05F 17/50; G06Q 10/08; G06Q 10/083; G05B 2219/320033; G05B 15/02; B33Y 50/02; G06F 17/50; B29C 64/393
USPC ............................................. 700/28, 212–244
See application file for complete search history.

(56) References Cited

U.S. PATENT DOCUMENTS

| | | | |
|---|---|---|---|
| 6,117,061 A * | 9/2000 | Popat | G09F 1/06 493/325 |
| 7,647,752 B2 * | 1/2010 | Magnell | B65B 5/02 493/52 |
| 7,788,883 B2 * | 9/2010 | Buckley | G06Q 10/083 382/154 |
| 8,160,992 B2 * | 4/2012 | Gombert | G06N 5/02 53/458 |
| 8,170,706 B2 * | 5/2012 | Gombert | G06F 17/50 700/118 |
| 8,286,236 B2 | 10/2012 | Jung et al. | |
| 8,412,588 B1 * | 4/2013 | Bodell | G06Q 10/06 700/119 |
| 8,429,754 B2 | 4/2013 | Jung et al. | |
| 8,515,826 B2 * | 8/2013 | Norman | G06Q 30/06 705/26.1 |
| 8,752,166 B2 | 6/2014 | Jung et al. | |
| 8,775,130 B2 * | 7/2014 | Walker | G06F 17/50 703/1 |
| 8,776,333 B2 * | 7/2014 | Van Den Bogart | A61G 17/08 27/1 |
| 9,019,555 B1 * | 4/2015 | Chappell | G06K 15/027 229/300 |
| 9,208,265 B2 * | 12/2015 | Wells | G06F 17/5009 |
| 9,229,674 B2 * | 1/2016 | Tapley | G06F 3/1296 |
| 9,298,706 B2 * | 3/2016 | Magnell | G06F 17/30 |
| 9,346,219 B2 * | 5/2016 | Taylor | B33Y 50/00 |
| 9,464,885 B2 * | 10/2016 | Lloyd | G01B 11/24 |
| 2003/0035138 A1 * | 2/2003 | Schilling | G06Q 10/087 358/1.15 |

(Continued)

*Primary Examiner* — Kenneth M Lo
*Assistant Examiner* — Mohammed Shafayet
(74) *Attorney, Agent, or Firm* — Kilpatrick Townsend & Stockton LLP

(57) ABSTRACT

A 3D shipping container engine may obtain item information for one or more items. Once obtained, container specifications may be determined for a container in which to store the one or more items based on the item(s) information. Based the container specifications, 3D additive manufacturing instructions may be provided for the container.

19 Claims, 10 Drawing Sheets

(56) References Cited

U.S. PATENT DOCUMENTS

| | | | |
|---|---|---|---|
| 2003/0083763 A1* | 5/2003 | Kiyohara | G06Q 10/087 700/97 |
| 2003/0200111 A1* | 10/2003 | Damji | G06Q 10/08345 705/335 |
| 2007/0221530 A1* | 9/2007 | Lee | B65D 81/052 206/522 |
| 2009/0060393 A1* | 3/2009 | Satoh | G06K 9/00476 382/305 |
| 2009/0164379 A1 | 6/2009 | Jung et al. | |
| 2009/0165127 A1 | 6/2009 | Jung et al. | |
| 2009/0282782 A1* | 11/2009 | Walker | B65B 5/024 53/410 |
| 2009/0313948 A1* | 12/2009 | Buckley | G06Q 10/083 53/456 |
| 2010/0031351 A1 | 2/2010 | Jung et al. | |
| 2010/0222908 A1* | 9/2010 | Gombert | G06F 17/50 700/98 |
| 2011/0087350 A1* | 4/2011 | Fogel | G06F 17/50 700/98 |
| 2011/0313878 A1* | 12/2011 | Norman | G06Q 30/0621 705/26.5 |
| 2012/0092724 A1* | 4/2012 | Pettis | B29C 67/0088 358/1.15 |
| 2012/0252488 A1* | 10/2012 | Hartmann | G06Q 10/08 455/456.1 |
| 2013/0072314 A1* | 3/2013 | Goodman | A63H 33/008 472/136 |
| 2013/0247519 A1* | 9/2013 | Clark | B65B 57/00 53/452 |
| 2014/0156053 A1* | 6/2014 | Mahdavi | B29C 67/0059 700/119 |
| 2014/0172736 A1* | 6/2014 | Saha | G06Q 10/083 705/330 |
| 2014/0191439 A1* | 7/2014 | Davis | B29C 67/0051 264/259 |
| 2015/0051999 A1* | 2/2015 | Apsley | G06Q 30/0621 705/26.5 |
| 2015/0052000 A1* | 2/2015 | Apsley | G06Q 30/0603 705/26.5 |
| 2015/0052023 A1* | 2/2015 | Apsley | G06Q 30/0635 705/26.81 |
| 2015/0052024 A1* | 2/2015 | Apsley | G06Q 30/0635 705/26.81 |
| 2015/0052025 A1* | 2/2015 | Apsley | G06Q 30/0635 705/26.81 |
| 2015/0096266 A1* | 4/2015 | Divine | B29C 67/0088 53/452 |
| 2015/0145158 A1* | 5/2015 | Levine | B29C 67/0085 264/40.1 |
| 2015/0220748 A1* | 8/2015 | Leach | G06F 21/608 726/26 |
| 2015/0221053 A1* | 8/2015 | Tapley | G06Q 50/184 705/310 |
| 2015/0249043 A1* | 9/2015 | Elian | H01L 21/4867 257/684 |
| 2015/0378353 A1* | 12/2015 | Williams | G05B 19/4183 700/119 |

* cited by examiner

TECHNIQUES FOR PRINTING 3D SHIPPING CONTAINERS

BACKGROUND

It has become common for merchants to utilize an electronic marketplace that provides users with the ability to order items using an electronic catalog of items. Merchants may utilize various modes of transport to deliver such items to the user. Delivery (e.g., shipping) can be costly to a merchant. Inefficient packaging of one or more items may lead to wasted space. Inadequate or inappropriate packaging may lead to items being damaged, or spoiled, while in transport. The user may lack the ability to ascertain whether the item has been exposed to potentially damaging environments. Conventional techniques can make it difficult to optimize packaging of items for shipment, causing the merchant to pay more shipping costs than necessary.

BRIEF DESCRIPTION OF THE DRAWINGS

Various embodiments in accordance with the present disclosure will be described with reference to the drawings, in which.

DETAILED DESCRIPTION

Figure 1:
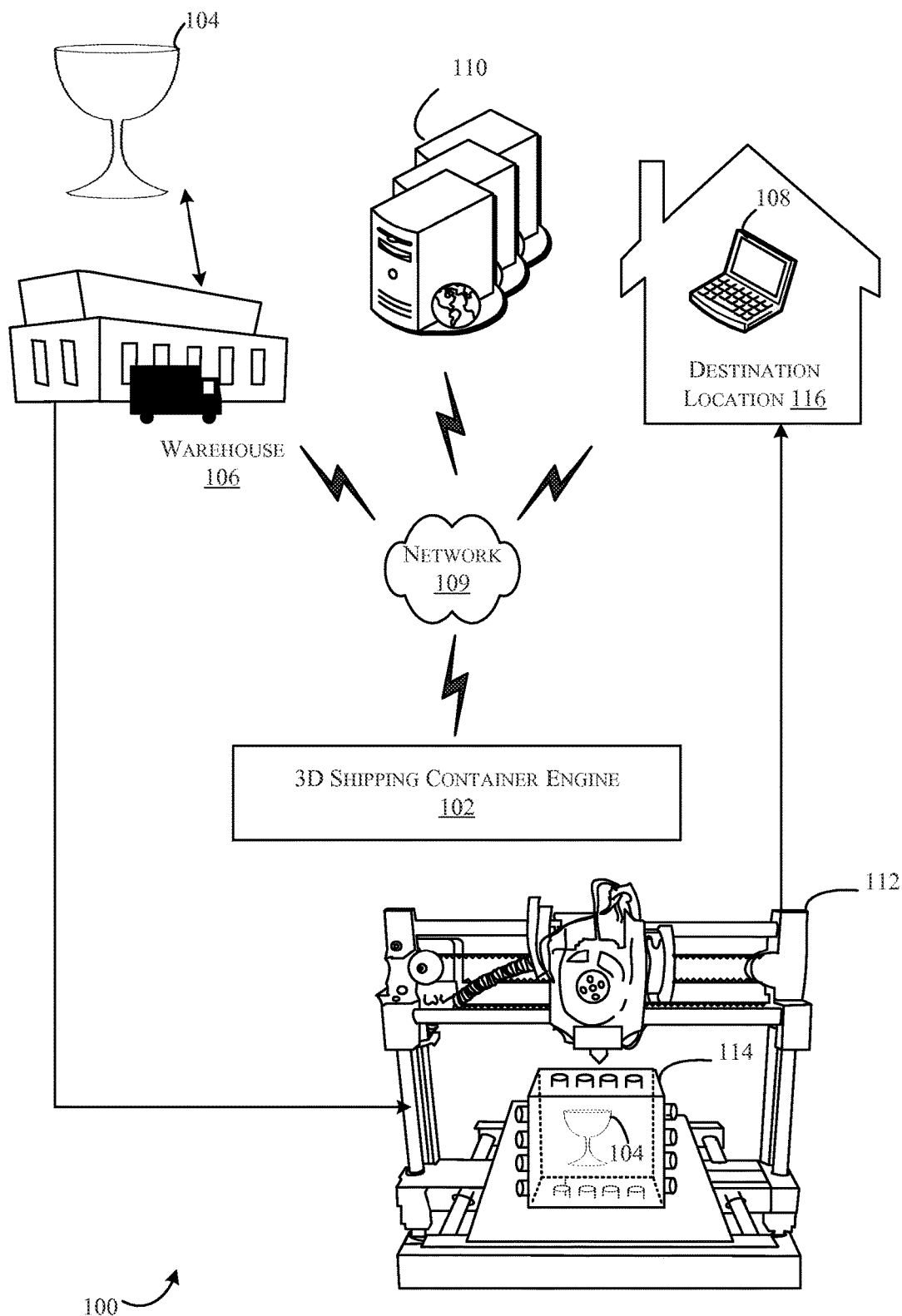
FIG. 1 is a schematic diagram illustrating an example environment suitable for implementing aspects of a three-dimensional (3D) shipping container engine, in accordance with at least one embodiment.

In the following description, various embodiments of the present disclosure will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Some or all of the processes described may be performed under the control of one or more computer systems configured with specific computer-executable instructions and may be implemented as code (e.g., executable instructions, one or more computer programs or one or more applications) executing collectively on one or more processors, by hardware or combinations thereof. The code may be stored on a non-transitory computer-readable storage medium, for example, in the form of a computer program including a plurality of instructions executable by one or more processors. The non-transitory computer-readable storage medium may be random access memory, storage, etc.

Techniques described herein are directed to generating customized shipping containers to ship items acquired by customers of an electronic marketplace. In at least one example, a system configured to manage an electronic marketplace may present information regarding multiple items. A user may peruse the electronic marketplace to find and select an item he wishes to obtain. Upon ordering the item, for instance, item information may be utilized to determine 3D printing instructions to produce a shipping container with which to ship the item. As used herein, "item information" may include, but is not limited to, a weight, a height, a width, a depth, a composition material, a material thickness, one or more shipping container features to be utilized when shipping the item, an indication of fragility, an indication of corrosive material, an indication of hazardous material, a temperature range, a humidity range, a quantity, a fluid amount, a geometric shape, a 3D model of the item, or any suitable combination of the above). The 3D printing instructions for the shipping container may include instructions related to a surface texture of the shipping container. The "surface texture" may include protrusions or cavities that can be configured to join to cavities or protrusions of other shipping containers to avoid slippage during transport or storage. Protrusion or cavities may include a deviation from a smooth surface. The surface texture may also include hook and loop (i.e. Velcro) surfaces that can be configured to join containers together. It may include textured surfaces (i.e. diamond plate, cross-hatch, ribbing, bumpy, shark skin, or similar) that provide friction to facilitate the handling or transport of the containers. Additionally, or alternatively, it may include loops, hooks, mounts, or other surface textures to facilitate handling of the container, for example via a lift, crane, drone, or other material handling equipment. The 3D printing instructions may be delivered to a particular 3D printer where they may be used to manufacture a shipping container for the item. In at least one case, the shipping container may be manufactured around the item resulting in a fully-sealed container in the item packaged inside. It should be noted, that difference instructions may be determined for each type of item and/or set of items. Accordingly, different shipping containers may be printed for different types and/or sets of items.

In accordance with at least one embodiment, item information, such as the physical characteristics of the item may be taken into account when creating the shipping container for the item. For example, a 3D model of the item may be generated or dimensions and weight information for the item may be captured and stored in a data store. Information such as whether the item is fragile or sensitive to temperature can also be captured and input into the data store. The physical characteristics of the item can then be used to produce a customized shipping container for the item. In a specific example, an item may have particular attributes that make the item fragile or incapable of being exposed to a variety of environments. As a non-limiting example, the user may select a wine glass for purchase. The wine glass may be susceptible to breaking during transport. The 3D shipping container engine may receive item information associated with the wine glass such as a height, a weight, a depth, a geometric shape description, and a composition material, for example. Based on the item information, the 3D shipping container may obtain, or otherwise determine, 3D printing instructions. The 3D printing instructions may be provided to a 3D printing apparatus, and the 3D shipping container may be printed around the wine glass. The wine glass may then be shipped to the user in the printed 3D shipping container.

In the following disclosure, it should be understood that although the term "warehouse" is used, any building or other structure suitable for storing an inventory of goods may be used. As an overview, an "item" may be a product, a product and its package, a sellable unit, or anything else that may be managed or otherwise physically stored as inventory. As used herein, an "electronic marketplace" includes a computer-facilitated market for participants (e.g., buyers and sellers) to conduct transactions including commercial and/or financial transactions. A "shipping container" may include any suitable enclosed, or partially enclosed, structure used to store or transport one or more items. Though the term "shipping container" is used, the container may be utilized for other purposes other than shipping (e.g., storage, relocation). A "transport container" may include any suitable enclosed, or partially enclosed, structure used to transport one or more shipping containers. As used herein, a "3D additive manufacturing apparatus" may include a computer-controlled device used to manufacture a three-dimensional object by laying down successive layers of material. Various methods may be used to melt or soften material to produce the layers (e.g., selective laser melting (SLM) or direct metal laser sintering (DMLS), selective laser sintering (SLS), fused deposition modeling (FDM). Alternatively, the 3D additive manufacturing apparatus may utilize a method for curing liquid materials using different sophisticated technologies (e.g. stereolithography (SLA)) or the 3D additive manufacturing apparatus may utilize a method directed to laminated object manufacturing (LOM) where thin layers are cut to shape and joined together (e.g. paper, polymer, metal).

Referring now to the drawings, in which like reference numerals represent like parts, FIG. 1 is a schematic diagram 100 illustrating an example environment for implementing aspects of the 3D shipping container engine 102, in accordance with at least one embodiment. In at least one embodiment, various items (e.g., wine glass 104) may be stored in warehouse 106. A user may utilize an electronic device (e.g., laptop 108) on network 109 (e.g., the Internet) to peruse an electronic marketplace managed by service provider computers 110. Service provider computers 110 may be operated by a retailer, or a representative of the retailer, as part of a computing system used to manage inventory in one or more warehouses using the electronic marketplace. The electronic device 108 may incorporate a mobile phone, a smart phone, a personal digital assistant (PDA), a laptop computer, a desktop computer, a thin-client device, a tablet PC, an electronic book (e-book) reader, or any suitable network-connected computing device.

Consider the case where the user wishes to purchase wine glass 104. In at least one example, an electronic order may be placed by the user on laptop 108 via the electronic marketplace, though any suitable method for placing an order may be utilized. The order may be received by service provider computers 110. Service provider computers 110 may create a shipping order that is received by 3D shipping container engine 102. Once received, 3D shipping container engine 102 may determine shipping container specifications for a container (e.g., shipping container 114) with which to ship wine glass 104. "Container specifications," as used herein may include, but is not limited to at least one of a height, a width, a depth, a surface texture, a geometric shape, one or more container features, or any suitable combination of the above. "Container features," as used herein, may include, but is not limited to, a container material, a container thickness, a temperature indicator, a moisture indicator, a corrosive indicator, a container-sealing mechanism, a shock absorption mechanism, a shock measurement device, a radio frequency identification (RFID) tag, or a transport mechanism, or any suitable combination of the above. A "transport mechanism," as used herein, is intended to mean a castor, a wheel, a cavity, a protrusion, or any suitable mechanism that causes the shipping container to be a deviation from a standard box-shaped container, the mechanism being used primarily for ease of transportation (e.g., fork lift indents for moving the container within a warehouse using a fork lift). 3D shipping container engine 102 may determine, or otherwise obtain, 3D printing instructions that, when executed, cause a 3D additive manufacturing apparatus (e.g., a 3D printer 112) to manufacture shipping container 114. For example, container specification and container features may be mapped to instruction templates. Instruction templates may be determined by first processing a model of a shipping container such that the model is dissected into a series of thin layers. A G-code file may be created containing instructions tailored for a particular printer. Several programs exist for creating G-code files, for example, Skeinfirge, Slic3r, Cura, Simplify3D, and KISSlicer. Based on the container specification and container features, one or more instruction templates may be selected and integrated together to create a complete shipping container instructions set.

3D shipping container engine may further provide instructions that cause wine glass 104 to be delivered to 3D printer 112. In at least one example, 3D printer 112 may manufacture a container around the wine glass 104 such that completion of the printing of the shipping container 114 results in wine glass 104 being fully encompassed by shipping container 114. In at least one example, 3D printer 112 may construct the shipping container, or portions of the shipping container, independently. Such shipping containers may then be assembled and the wine glass 104 packaged in the assembled container. Upon completion of the packaging process, general shipping procedures may be followed to deliver shipping container 114 to the user at destination location 116.

Figure 2:
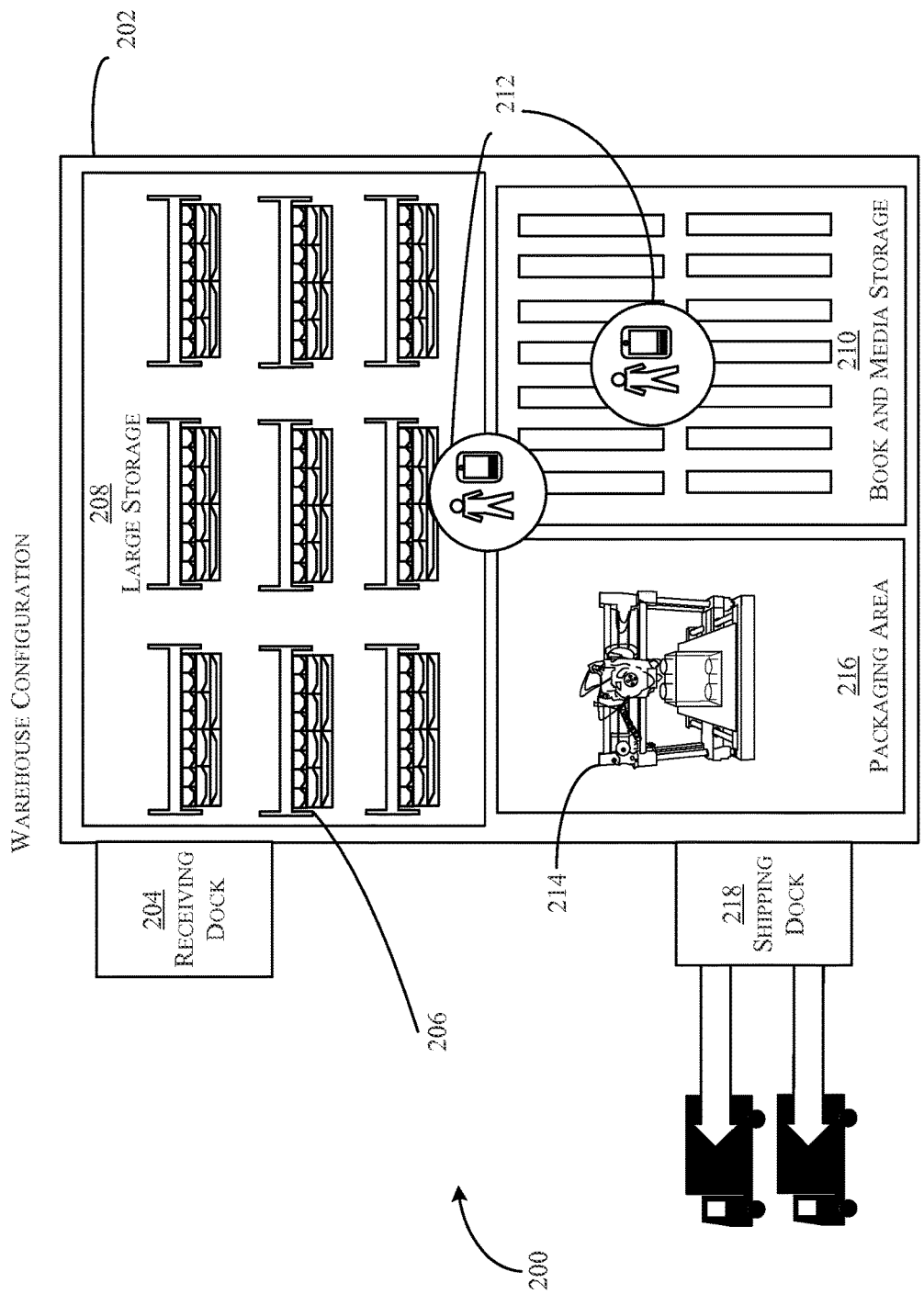
FIG. 2 is a schematic diagram depicting an example floor plan of a warehouse wherein the 3D shipping container engine may be utilized, in accordance with at least one embodiment.

FIG. 2 is a schematic diagram 200 depicting an example floor plan of a warehouse wherein a 3D shipping container engine (e.g., the 3D shipping container engine 102 of FIG. 1) may be utilized, in accordance with at least one embodiment. In this example warehouse, items received via a receiving dock 204 may be scanned and subsequently stored in various sections (i.e., locations) of the warehouse 202, each section potentially containing one or more sets of bins 206. In some examples, large items may be housed in the Large Storage section 208. Additionally, books and/or media items may be housed in the Book and Media Storage section 210. Other sections, zones, or other areas of the warehouse may be envisioned, as desired.

Further, upon receiving a customer order or other instruction, the stower 212 (e.g., a human being or a machine) may collect the ordered items from a storage sections and deposit the items in the packaging area 216. A 3D printer 214 (e.g., the 3D printer 112 of FIG. 1) may reside in packaging area 216 as depicted, or in any other suitable location. In some examples, once packaged, the items may be shipped to the customer via the shipping dock 218. This depiction of the configuration of the warehouse should be understood to be illustrative and non-limiting, as various warehouse configurations may be implemented.

The manner in which an item is packaged within a container stored in warehouse 202 may have an impact on the overall spatial efficiency of warehouse 202. In some embodiments, it may be more efficient to store items in containers that are custom fit for the item resulting in a smaller container than would have been utilized otherwise. Additionally, item storage processes may have a large impact on quality assurance. For example, items may have particular storage requirements such as a requirement that the container have a shock absorption feature. For breakable items, this is especially important given that shifting of the storage container that lacks shock absorption mechanisms may cause damage to the item. In at least one embodiment, a storage requirement regarding the temperature of the storage location may impact the longevity of the item's lifespan. This may especially be true of perishable food items, but may also be applicable to the storage of batteries, medications, and other items which require storage at a particular thermal range. Each consideration above would also be applicable for containers used to ship one or more items.

Figure 3:
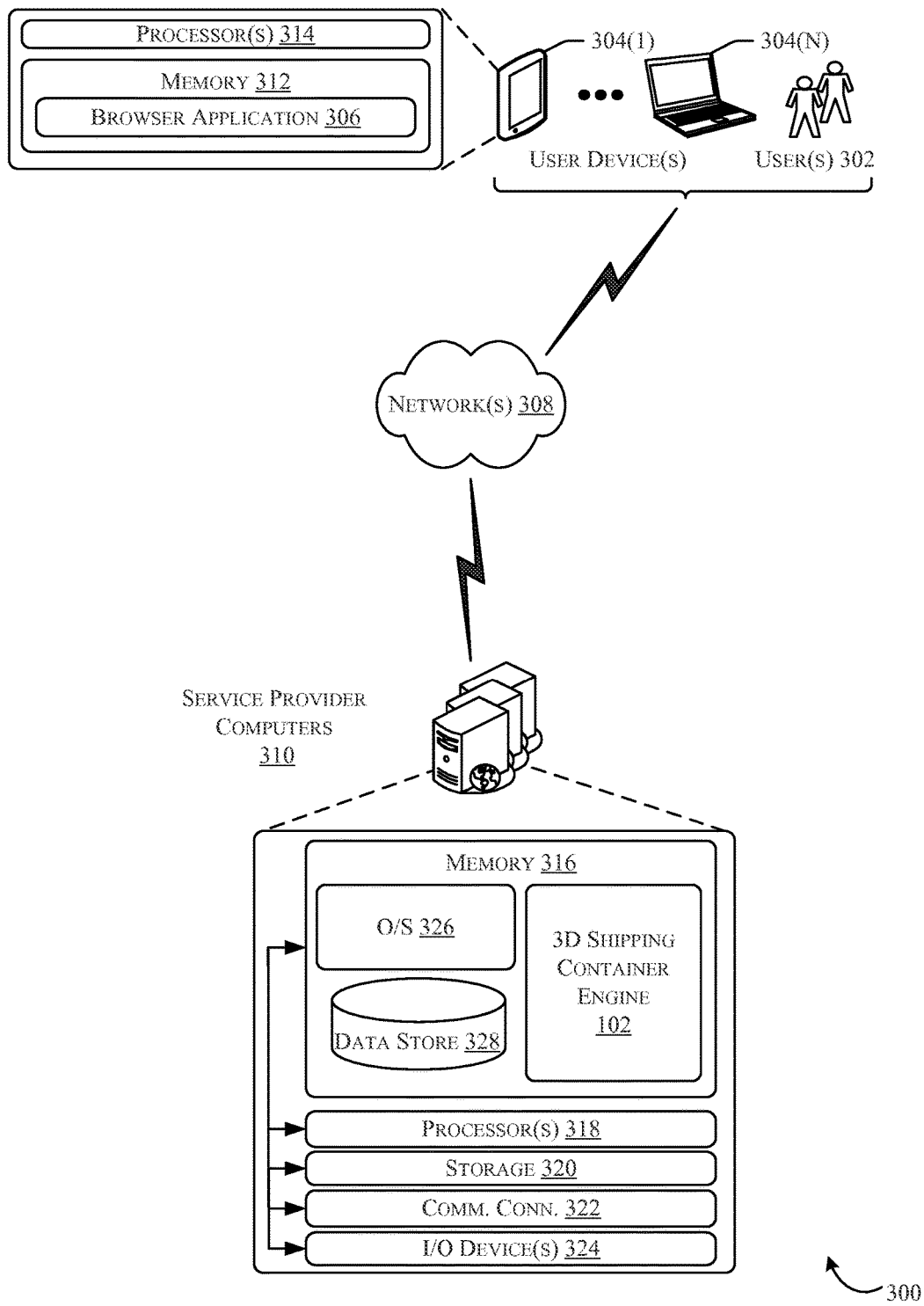
FIG. 3 is an example architecture of the 3D shipping container engine, in accordance with at least one embodiment.

FIG. 3 illustrates an example architecture for providing 3D shipping container engine 102, in accordance with at least one embodiment. In architecture 300, one or more users 302 may utilize user computing devices 304(1)-(N) (collectively, user computing devices 304) to access a browser application 306 (e.g., a browsing application capable of presenting a network page of an electronic marketplace) or a user interface accessible through the browser application 306 via one or more networks 308. In some aspects, the browser application 306 may be hosted, managed, and/or provided by a computing resources service or service provider, such as by utilizing one or more service provider computers 310 (e.g., the service provider computers 110 of FIG. 1). The one or more service provider computers 310 may, in some examples, provide computing resources such as, but not limited to, client entities, low latency data storage, durable data storage, data access, management, virtualization, cloud-based software solutions, electronic content performance management, etc. The one or more service provider computers 310 may also be operable to provide web hosting, computer application development, and/or implementation platforms, combinations of the foregoing, or the like to the one or more users 302.

In some examples, the networks 308 may include any one or a combination of many different types of networks, such as cable networks, the Internet, wireless networks, cellular networks, and other private and/or public networks. While the illustrated example represents the users 302 accessing the browser application 306 over the networks 308, the described techniques may equally apply in instances where the users 302 interact with the service provider computers 310 via the one or more user computing devices 304 over a landline phone, via a kiosk, or in any other suitable manner. It should be appreciated that the described techniques may apply in other client/server arrangements (e.g., set-top boxes, etc.), as well as in non-client/server arrangements (e.g., locally stored applications, etc.).

As described briefly above, the browser application 306 may allow the users 302 to interact with the service provider computers 310 such as to access information associated with selling items via an electronic marketplace. The one or more service provider computers 310, perhaps arranged in a cluster of servers or as a server farm, may host the browser application 306 and/or cloud-based software services. Other server architectures may also be used to host the browser application 306 and/or cloud-based software services. The browser application 306 may be capable of handling requests from many users 302 and serving, in response, various user interfaces that can be rendered at the user computing devices 304 such as, but not limited to, perceived latency or the like. The browser application 306 can present any suitable type of website that supports user interaction, including search engine sites. As discussed above, the described techniques can similarly be implemented outside of the browser application 306, such as with other applications running on the user computing devices 304.

The user computing devices 304 may be any suitable type of computing device such as, but not limited to, a mobile phone, a smart phone, a personal digital assistant (PDA), a laptop computer, a desktop computer, a thin-client device, a tablet PC, an electronic book (e-book) reader, etc. In some examples, the user computing devices 304 may be in communication with the service provider computers 310 via the networks 308, or via other network connections. Additionally, the user computing devices 304 may be part of the distributed system managed by, controlled by, or otherwise part of the service provider computers 310.

In one illustrative configuration, the user computing devices 304 may include at least one memory 312 and one or more processing units (or processor(s)) 314. The processor(s) 314 may be implemented as appropriate in hardware, computer-executable instructions, firmware, or combinations thereof. Computer-executable instruction or firmware implementations of the processor(s) 314 may include computer-executable or machine-executable instructions written in any suitable programming language to perform the various functions described.

The memory 312 may store program instructions that are loadable and executable on the processor(s) 314, as well as data generated during the execution of these programs. Depending on the configuration and type of user computing device, the memory 312 may be volatile (such as random access memory (RAM)) and/or non-volatile (such as read-only memory (ROM), flash memory, etc.). The user computing devices 304 may also include additional removable storage and/or non-removable storage including, but not limited to, magnetic storage, optical disks, and/or tape storage. The disk drives and their associated computer-readable media may provide non-volatile storage of computer-readable instructions, data structures, program modules, and other data for the computing devices. In some implementations, the memory 312 may include multiple different types of memory, such as static random access memory (SRAM), dynamic random access memory (DRAM), or ROM.

Turning to the contents of the memory 312 in more detail, the memory 312 may include an operating system and one or more application programs, modules, or services for implementing the features disclosed herein including at least the perceived latency, such as via the browser application 306 or dedicated applications (e.g., smart phone applications, tablet applications, etc.). The browser application 306 may be configured to receive, store, and/or display a network page or other interface for interacting with the service provider computers 310. Additionally, the memory 312 may store access credentials and/or other user information such as, but not limited to, user IDs, passwords, and/or other user information. In some examples, the user information may include information for authenticating an account access request such as, but not limited to, a device ID, a cookie, an IP address, a location, or the like.

In some aspects, the service provider computers 310 may also be any suitable type of computing devices such as, but not limited to, a mobile phone, a smart phone, a personal digital assistant (PDA), a laptop computer, a desktop computer, a server computer, a thin-client device, a tablet PC, etc. Additionally, it should be noted that in some embodiments, the service provider computers are executed by one or more virtual machines implemented in a hosted computing environment. The hosted computing environment may include one or more rapidly provisioned and released computing resources, which computing resources may include computing, networking and/or storage devices. A hosted computing environment may also be referred to as a cloud-computing environment. In some examples, the service provider computers 310 may be in communication with the user computing devices 304 and/or other service providers via the networks 308 or via other network connections. The service provider computers 310 may include one or more servers, perhaps arranged in a cluster, as a server farm, or as individual servers not associated with one another. These servers may be configured to implement the content performance management described herein as part of an integrated, distributed computing environment.

In one illustrative configuration, the service provider computers 310 may include at least one memory 316 and one or more processing units (or processor(s)) 318. The processor(s) 318 may be implemented as appropriate in hardware, computer-executable instructions, firmware, or combinations thereof. Computer-executable instruction or firmware implementations of the processor(s) 318 may include computer-executable or machine-executable instructions written in any suitable programming language to perform the various functions described.

The memory 316 may store program instructions that are loadable and executable on the processor(s) 318, as well as data generated during the execution of these programs. Depending on the configuration and type of service provider computers 310, the memory 316 may be volatile (such as RAM) and/or non-volatile (such as ROM, flash memory, etc.). The service provider computers 310 or servers may also include additional storage 320, which may include removable storage and/or non-removable storage. The additional storage 320 may include, but is not limited to, magnetic storage, optical disks and/or tape storage. The disk drives and their associated computer-readable media may provide non-volatile storage of computer-readable instructions, data structures, program modules, and other data for the computing devices. In some implementations, the memory 316 may include multiple different types of memory, such as SRAM, DRAM, or ROM.

The memory 316, the additional storage 320, both removable and non-removable, are all examples of computer-readable storage media. For example, computer-readable storage media may include volatile or non-volatile, removable or non-removable media implemented in any method or technology for storage of information such as computer-readable instructions, data structures, program modules, or other data. The memory 316 and the additional storage 320 are all examples of computer storage media. Additional types of computer storage media that may be present in the service provider computers 310 may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, or any other medium which can be used to store the desired information and which can be accessed by the service provider computers 310. Combinations of any of the above should also be included within the scope of computer-readable media.

Alternatively, computer-readable communication media may include computer-readable instructions, program modules, or other data transmitted within a data signal, such as a carrier wave, or other transmission. However, as used herein, computer-readable storage media does not include computer-readable communication media.

The service provider computers 310 may also contain communications connection(s) 322 that allow the service provider computers 310 to communicate with a stored database, another computing device or server, user terminals and/or other devices on the networks 308. The service provider computers 310 may also include I/O device(s) 324, such as a keyboard, a mouse, a pen, a voice input device, a touch input device, a display, speakers, a printer, etc.

Turning to the contents of the memory 316 in more detail and will be described in further detail in FIG. 4, the memory 316 may include an operating system 326, one or more data stores 328, and/or one or more application programs, modules, or services for implementing the features disclosed herein including 3D shipping container engine 102.

Figure 4:
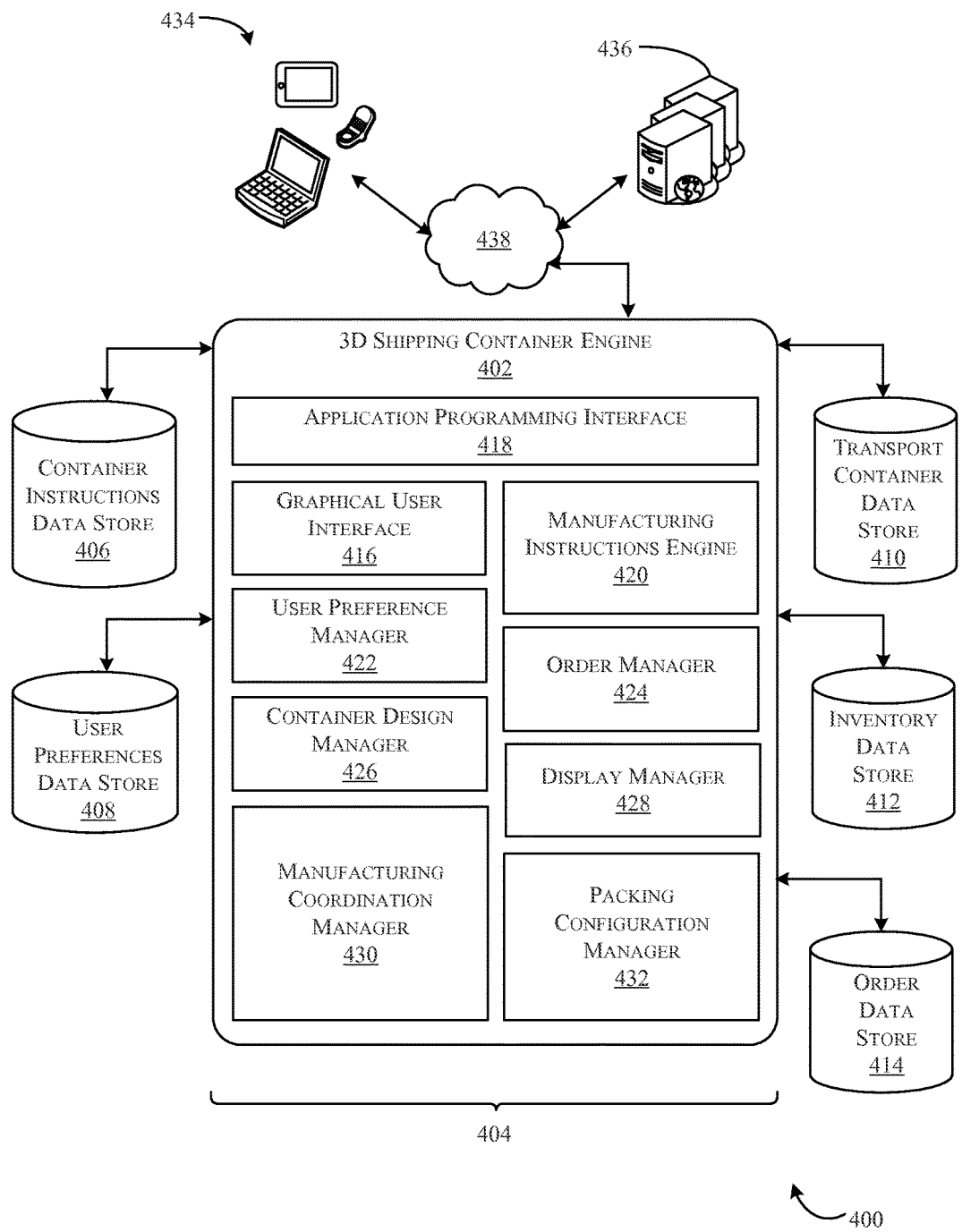
FIG. 4 is a schematic diagram of the 3D shipping container engine, in accordance with at least one embodiment.

FIG. 4 schematically illustrates an example computer architecture 400 for the 3D shipping container engine 402 (e.g., the 3D shipping container engine 102 of FIG. 1) including a plurality of modules 404 that may carry out various embodiments. The modules 404 may be software modules, hardware modules, or a combination thereof. If the modules 404 are software modules, the modules 404 can be embodied on a computer readable medium and processed by a processor in any of the computer systems described herein. It should be noted that any module or data store described herein, may be, in some embodiments, a service responsible for managing data of the type required to make corresponding calculations. The modules 404 may be configured in the manner suggested in FIG. 4 or the modules 404 may exist as separate modules or services external to the 3D shipping container engine 402.

In the embodiment shown in the drawings, a container instructions data store 406, a user preferences data store 408, a transport container data store 410, an inventory data store 412, and an order data store 414 are shown, although data can be maintained, derived, or otherwise accessed from various data stores, either remotely or locally, to achieve the functions described herein. The 3D shipping container engine 402, shown in FIG. 4, includes various modules such as a graphical user interface 416, an application programming interface 418, a manufacturing instructions engine 420, a user preference manager 422, an order manager 424, a container design manager 426, a display manager 428, a manufacturing coordination manager 430, and a packing configuration manager 432. Some functions of the modules 416, 418, 420, 422, 424, 426, 428, 430, and 432 are described below. However, for the benefit of the reader, a brief, non-limiting description of each of the modules is provided in the following paragraphs.

In accordance with at least one embodiment, a process is enabled for utilizing 3D shipping container engine 402. For example, a user (e.g., a consumer) may utilize one or more devices 434 to interact with service provider computers 436 (e.g., the service provider computers 332) to receive information pertaining to a particular item offered for consumption on an electronic marketplace provided by service provider computers 436. Service provider computers 332 may be configured to communicate with networks 438. As part of a consumer registration process, or at any suitable time, user preference information regarding shipping preferences may be received by 3D shipping container engine 402 via application programming interface 418 and graphical user interface 416, both components of 3D shipping container engine 402. It should be appreciated that the networks 438 may be the same or similar as the networks 308 described in connection with FIG. 3. Application programming interface 418 and/or graphical user interface 416 may be utilized in any suitable example described herein as a means for receiving information by 3D shipping container engine 402.

In accordance with at least one embodiment, a user (e.g., a consumer) of an item offered for consumption on an electronic marketplace may utilize user devices 434 (e.g., electronic device 108 of FIG. 1) to provide user preference information, shipping information, payment information, and generally interact with network pages provided by the service provider computers 436.

In accordance with at least one embodiment, user preference manager 422, a component of 3D shipping container engine 102, may be configured to receive user preference data. Such user preference data may include one or more indications that a user prefers to have fragile items packaged differently than items that are unlikely to break in transit. Upon receipt of such user preference data, user preference manager 422 may be configured to initiate one or more workflows with one or more components of 3D shipping container engine 102. User preference manager 422 may further be configured to cause the storage of user preference data in user preferences data store 408 or any suitable storage location.

In accordance with at least one embodiment, manufacturing instructions engine 420 a component of 3D shipping container engine 102, may be configured to receive item information. Upon receipt of such information, manufacturing instructions engine 420 may be configured to retrieve additional information related to the item from inventory data store 412, a data store configured to store information regarding an inventory of items offered in the electronic marketplace. Upon retrieval of item information, manufacturing instructions engine 420 may be configured to determine an optimal shipping container for one or more items. An optimal shipping container, in at least one example, is a shipping container that maximizes space used in the shipping container and/or minimizes empty space between the one or more items. Additionally, or alternatively, manufacturing instructions engine 420 may be configured to retrieve information related to container instructions from container instructions data store 406, a data store configured to store information related to three-dimensional instructions for manufacturing containers. Manufacturing instructions engine 420 may be further configured to interact with manufacturing coordination manager 430, a component of 3D shipping container engine 402. For example, manufacturing instructions engine 420 may transmit three-dimensional instructions for manufacturing a container to manufacturing coordination manager 430. Manufacturing instructions engine 420 may additionally, or alternatively, be configured to interact with transport container data store 410, a data store configured to store information related to transport containers. In a non-limiting example, transport container data store 410 may be configured to store information related to dimensions of one or more transport containers. Manufacturing instructions engine 420 may additionally, or alternatively, be configured to interact with order data store 414, a data store configured to store information related to orders made on an electronic marketplace.

In accordance with at least one embodiment, order manager 424, a component of 3D shipping container engine 402, may be configured to interact with order data store 414. For example, order manager 424 may retrieve historical order data for the purposes of determining whether an item included in an order has a history of breaking during shipment. Order manager 424 may further be configured to receive an order containing item information via application programming interface 418. Order manager 424 may be configured to interact with manufacturing instructions engine 420. For example, order manager 424 may transmit item information for an item, or items, included in an order to manufacturing instructions engine 420. Additionally, or alternatively, order manager 424 may be configured to interact with inventory data store 412 to retrieve information related to one or more items stored in inventory.

In accordance with at least one embodiment, container design manager 426, a component of 3D shipping container engine 102, may be configured to receive container design information via application programming interface 418 or container instructions data store 406. Container instructions data store 406 may be configured to store design details related to a container. For example, container design manager 426 may be configured to receive design information from a third-party merchant indicating a specific container design to be used when items provided by the third-party merchant are packaged. Container design manager 426 may further be configured to interact with manufacturing instructions engine 420.

In accordance with at least one embodiment, display manager 428, a component of 3D shipping container engine 102, may interact with one or more components of the 3D shipping container engine 102 in order to provide instructions to a user. For example, a container having multiple pieces may be manufactured. Display manager 428 may be configured to display assembly instructions for the container to a user.

In accordance with at least one embodiment, manufacturing coordination manager 434, a component of 3D shipping container engine 102, may interact with one or more components of the 3D shipping container engine 102 in order to communicate three-dimensional shipping instructions to a device (e.g., a 3D printer located in a warehouse). Manufacturing coordination manager 430 may be further configured to interact with inventory data store 412 in order to ascertain item location within a warehouse with respect to 3D printer location within a warehouse.

In accordance with at least one embodiment, packing configuration manager 432, a component of 3D shipping container engine 102, may interact with one or more components of the 3D shipping container engine 102 (e.g., transport container data store 410 and inventory data store 412) in order to determine an optimal packing configuration (e.g., a packing configuration that maximizes the number of items packed and minimizes an amount of wasted space) for one or more items in a shipping container. Likewise, packing configuration manager 432 may be configured to interact with transport container data store 410 in order to determine an optimal packing configuration of one or more shipping containers to be shipped within one or more transport containers. For example, an optimal packing configuration may be determined by analyzing specifications of the transport container to determine an area and configuration of space that is available within the transport container. An algorithm for determining the optimal packing configuration may utilize the determined area and configuration of the available space within the transport container as well as information regarding one or more shipping containers in order to determine an optimal packing configuration that maximizes the number of shipping containers packed while minimizing the amount of empty space. Configuration manager 432 may be further configured to interact with display manager 428 in order to display packing instructions to a user.

Figure 5:
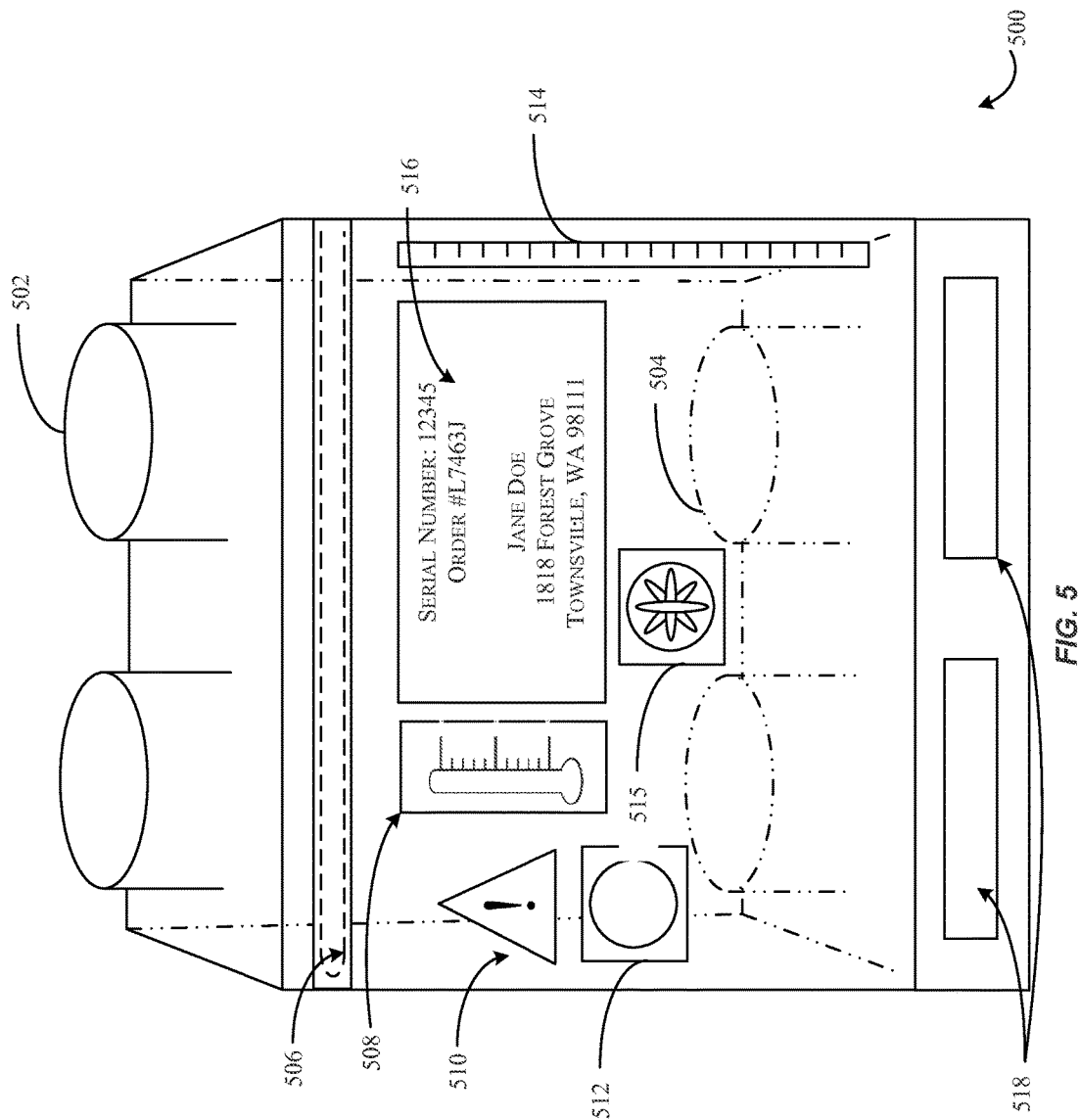
FIG. 5 is a schematic diagram illustrating a sample 3D shipping container.

FIG. 5 is a schematic diagram illustrating a sample 3D shipping container 500. 3D shipping container 500 is merely one example of a shipping container capable of being manufactured using 3D shipping container engine (e.g., the 3D shipping container engine 102), in accordance with at least one embodiment. It should be noted that the following features depicted in FIG. 5 are not necessarily to scale.

In accordance with at least one embodiment, 3D shipping container 500 includes a variety of container features. Each of the following features, or any suitable combination thereof, may be selected by a user and indicated in user preference information communicated to the 3D shipping container engine (e.g., utilizing user preference manager 422). Additionally, such features, or a combination of such features, may be included in a container due to a determination of various other conditions (e.g., information related to an item, past order history, item return history). Container features may be included as part of the container structure or as separate manufactured units to be assembled with, or otherwise connected to, the 3D shipping container 500.

In accordance with at least one embodiment, 3D shipping container 500 may include a surface texture. A surface texture, as used herein, may include any suitable variation from a substantially smooth container surface. The surface texture may occur on one or more portions of the container. As a non-limiting example, the surface texture of FIG. 5 includes raised connectors 502 located on the uppermost side of the 3D shipping container 500. The surface texture of 3D shipping container 500 additionally includes indents 504. Connectors 502 may be configured to be joined with other indents of one or more other containers having similar indents as indents 504 of 3D shipping container 500. When connectors 502 are joined with indent of another container, the containers may be substantially connected. Such connection may reduce movement between the two containers. Other surface textures may be used for the same purpose including, but not limited to, a velcro-like texture, raised bumps or sandpaper-like texture, or any suitable surface texture that results in an increase in friction when an object is placed, or otherwise touching said surface texture.

In accordance with at least one embodiment, 3D shipping container 500 may include a sealing mechanism. FIG. 5 depicts a sealing mechanism 506 that includes utilizing a material of a different tensile strength than the material used to manufacture the remaining portion of 3D shipping container 500. In a non-limiting example, 3D shipping container 500 may be manufactured using a thicker plastic than a plastic used to manufacture sealing mechanism 506. When a user wishes to open 3D shipping container 500, he may, for example, pull a tab located on sealing mechanism 506 and "peel" back the thinner plastic of sealing mechanism 506, resulting in removal of the thinner plastic from the rest of 3D shipping container 500. In FIG. 5, though not shown, sealing mechanism 506 may continuously span each side of 3D shipping container 500. Thus, when the thinner plastic of sealing mechanism 506 is removed, a top portion of 3D shipping container 500 may be removed allowing a user to access the contents of 3D shipping container 500. Though this example includes a sealing mechanism that may not be reattached, other sealing mechanisms may be utilized to allow the 3D shipping container 500 to be resealed. For example, 3D shipping container 500 may include corrugations on a top and bottom portion of 3D shipping container 500 that allow the top port of 3D shipping container 500 to be removed, and later reconnected to a bottom portion of 3D shipping container 500. Alternatively, for a round 3D shipping container, a screw-top may be utilized to open 3D shipping container 500 when a portion of the 3D shipping container 500 in is rotated in one direction, and to close 3D shipping container 500 when the portion of the 3D shipping container 500 is rotated in the opposite direction. Other sealing mechanisms may be utilized and may be apparent to one skilled in the art of packaging.

In accordance with at least one embodiment, 3D shipping container 500 may include temperature measurement mechanism 508. Temperature measurement mechanism 508 may indicate a highest temperature reached, or a lowest temperature reached, or both. Utilizing temperature measurement mechanism 508 a user may ascertain information regarding temperatures of environments encountered by the container while in transit. Alternatively, the user may ascertain information regarding temperatures realized within the container. In an alternative embodiment, item information may be used to manufacture a custom temperature gauge specific to the items contained in 3D shipping container 500. For example, an item stored or shipped in 3D shipping container 500 may be damaged or spoiled if temperatures inside the 3D shipping container 500 exceed 100 degrees Fahrenheit. Temperature measurement mechanism 508 may indicate to a user that 102 degrees, for instance, was reached. Additionally, or alternatively, temperature measurement mechanism 508 may indicate that a temperature limit for the item was reached without specifying an exact measurement or amount exceeded.

In accordance with at least one embodiment, 3D shipping container 500 may include hazardous material indicator 510. Hazardous material indicator 510 may indicate that the contents of the 3D shipping container 500 include hazardous materials. Additionally, or alternatively, hazardous material indicator 510 may indicate that the container has come in contact with a hazardous material. In a non-limiting example, the 3D shipping container 500 may contain a corrosive material. During shipment, the corrosive material may have leaked from an inner container, coming in contact with the interior of the 3D shipping container 500. Hazardous material indicator 510 may have access to both the exterior and the interior of the 3D shipping container 500. In such a case, hazardous material indicator 510 may be configured to indicate that opening the 3D shipping container 500 is unwise due to leakage of the corrosive material contained within.

In accordance with at least one embodiment, 3D shipping container 500 may include a moisture indicator 512. In at least one example, moisture indicator 512 may be configured to indicate that the container has come in contact with liquid. Additionally, or alternatively, moisture indicator 512 may be configured to indicate that liquid has come in contact with the inner walls of 3D shipping container 500. Alternatively, moisture indicator 512 may be configured to indicate that the 3D shipping container 500 has traveled through an area over a particular level of humidity.

In accordance with at least one embodiment, 3D shipping container 500 may include a fluid level indicator 514. In at least one example, fluid level indicator 514 may be configured to enable a user to ascertain a level of fluid remaining in 3D shipping container 500. As a non-limiting example, consider that a user ordered a gallon of milk that was shipped to him using 3D shipping container 500. The user may utilize the 3D shipping container 500 as a storage container and use fluid level indicator 514 as a mechanism to ascertain how much milk is remaining in 3D shipping container 500 without having to open the 3D shipping container. In this manner, 3D shipping container 500 may be utilized as a long-term storage container.

In accordance with at least one embodiment, 3D shipping container 500 may include a shock measurement device 515 (e.g., an accelerometer). In at least one example, shock measurement device 515 may include, but is not limited to, an accelerometer, an altimeter, a gyroscope, or the like. The shock measurement device 515 may be configured to indicate that an item was dropped or otherwise exposed to a shock exceeding a threshold amount of force. In some example, an excessive shock measurement may indicate that the item is no longer safe to use. Additionally, the shock measurement device 515 may enable a user to determine fault if the item is damaged during transit.

In accordance with at least one embodiment, 3D shipping container 500 may include markings 516. In at least one example, markings 516 may be printed, etched, or otherwise included as part of the 3D shipping container. In the example depicted in FIG. 5, markings 516 indicate shipping information such as a serial number for the item, an order number, and a shipping address. Any suitable information or design may be etched, printed or otherwise included in 3D shipping container 500. For example, a third-party merchant may submit a logo or container design, for example, to the 3D shipping container engine 102, utilizing container design manager 430. A logo corresponding to the submitted design may be etched, printed, or otherwise included in 3D shipping container 500 allowing the third-party merchant to customize the look of the shipping container while, in some cases, advertising its brand.

In accordance with at least one embodiment, 3D shipping container 500 may include transport mechanisms 518. Transport mechanisms 518 (e.g., cavities to be used with a fork lift) may be utilized to aid in moving the 3D shipping container. For example, an item or items contained in the 3D shipping container 500 may be too heavy for a human to lift. Thus, a forklift may be required to move 3D shipping container. 3D shipping container 500 may be manufactured to take into account a method of transporting the 3D shipping container. For example, in FIG. 5, the 3D shipping container is depicted as having forklift cavities for transport mechanisms 518 to be utilized when picking up the 3D shipping container with a forklift. A forklift is a non-limiting example of a device used for moving the 3D shipping container. The 3D shipping container may further include any suitable mechanism that can be used to move the 3D shipping container (e.g., hooks, holes, rings).

It should be noted that any, or all, of the indicators or devices described above may include a colorized indicator that indicates whether a condition has been met or has not been met (e.g., exposed to water/not exposed to water). In at least one embodiment, any or all of the indicators or devices discussed above with respect to container features may include onboard memory, at least one processor, and a user interface. In some cases, these indicators/devices may track data sensed by the indicator. For example, the shock measurement device 515 may track and record all acceleration events and a date and time when such event occurred. In some example, these indicators may include a wireless transmitter that enables the indicator/device to communicate the sensed data away from the indicator/device. In some cases, this data may also be signed/authenticated with a private key. Such data may be, for example, sent to the user via an electronic marketplace interface. The user could use such data to determine that, for example, an item has been damaged in shipment, potentially before the item arrives at the destination.

Figure 6:
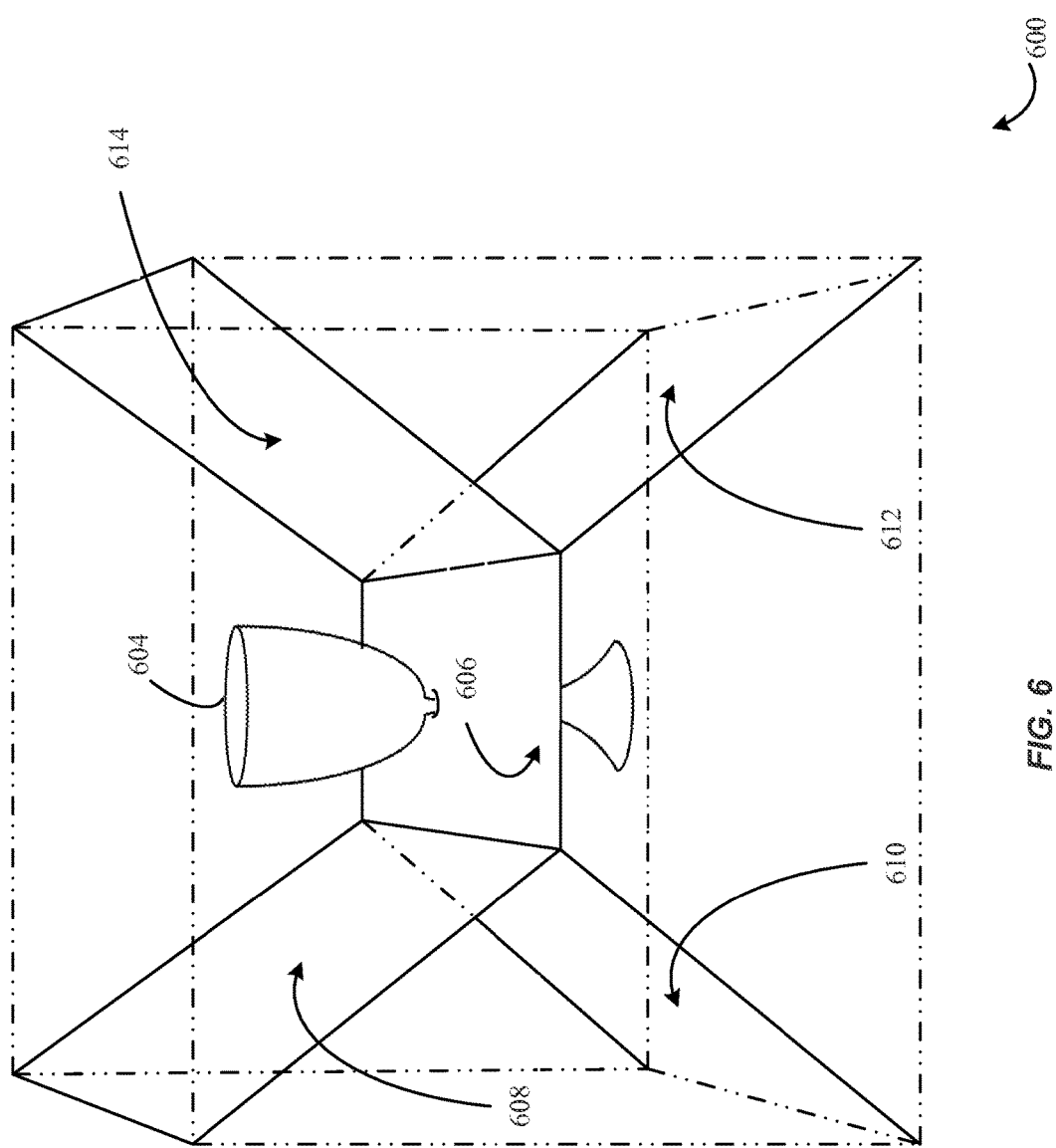
FIG. 6 is a schematic diagram illustrating another sample 3D shipping container.

FIG. 6 is a schematic diagram illustrating another sample 3D shipping container 600 (e.g., the 3D shipping container 500 of FIG. 5). In this example, 3D shipping container 600 may include a shock absorption mechanism such as shock absorption mechanism 602. The shock absorption mechanism 602 of FIG. 6 includes multiple connecting pieces that include a rectangular cradle piece 606 that cradles an item (e.g., a wine glass 604), suspended by the use of four rectangular planes 608-614 each connected at approximately a 45 degree angle with respect an edge of the interior of 3D shipping container 600. Using the sample 3D shipping container 600, the wine glass 604 may be suspended within 3D shipping container 600, unable to shift outside a threshold amount in any given direction. The shock absorption mechanism 602 is merely an illustrative example, as other shock absorption mechanisms (e.g., springs, inflated packets, etc.) may be utilized. Shock absorption mechanisms employed may be built into the 3D shipping container, or may be manufactured as a separate object to be assembled with the 3D shipping container.

Figure 7:
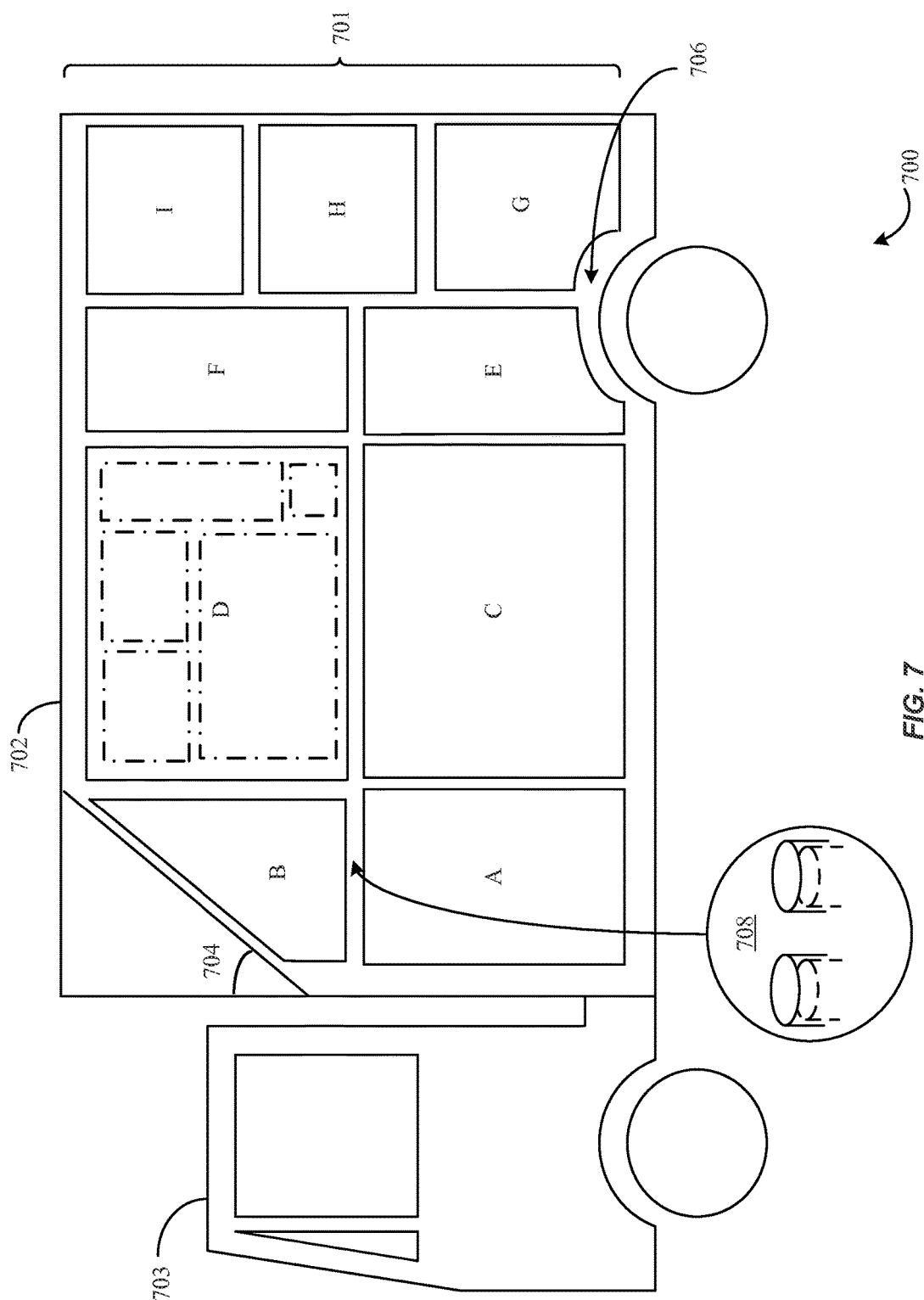
FIG. 7 is a schematic diagram illustrating a sample transport container.

FIG. 7 is a schematic diagram 700 illustrating a sample transport container 702.

Shipping containers 701 are to be included in a shipment. In this example, transport container 702 is to be transported by semi-truck 703, though various transportation vehicles may be utilized. Transport container 702 may include various interior angles. For example, the ceiling of transport container 702 includes an angle 704 of approximately 45 degrees. This type of transport container feature may cause difficulties in packing a shipping container having a rectangular shape. However, shipping container B may be manufactured to include a corresponding angle that can enable shipping container B to utilize an optimized amount of space within the transport container 702 given the ceiling angle 704. Similarly, shipping container E and shipping container G may be manufactured to account for a non-flat portion of the floor 706 of transport container 702.

As discussed in a previous example, shipping containers 701 may include one or more surface textures such as connectors 708. Connectors 708 may substantially join shipping containers 701 together (e.g., along a vertical adjoining edges, along horizontally adjoining edges, or both) so that none of the shipping containers may shift outside a threshold amount in any given direction. Utilizing these connectors may reduce damage to shipped items than may have otherwise been realized if the connectors had not been used.

In accordance with at least one embodiment, 3D shipping container engine 102 may be utilized to determine an optimal packing configuration for shipping containers 701, and alternatively, or additionally, transport container 702. 3D shipping container engine 102, utilizing, for example, packing configuration manager 426 of FIG. 4, may calculate an optimal packing configuration for a shipping container (e.g., shipping container D). The packing configuration manager 426 may use information obtained from inventory data store 412, or item information contained in an order received by order manager 436, to determine dimensions of one or more items to be included in shipping container D. Given such dimensions, packing configuration manager 426 may determine an optimized configuration with which shipping container D should be packed in order to limit the amount of wasted space in shipping container D. Instructions for packing items (or smaller shipping containers) into shipping container D may be displayed to a user using a display manager 428, for example. Similarly, packing configuration manager 426 may use information related to shipping containers 701 to determine an optimized packing configuration for the transport container 702. Manufacturing instructions engine 420 may use transport container information (e.g., transport container dimensions) contained in transport container data store 410 to determine manufacturing instructions for shipping containers 701. In other words, shipping containers 701 may be manufactured based on the dimensions of transport container 702.

Figure 8:
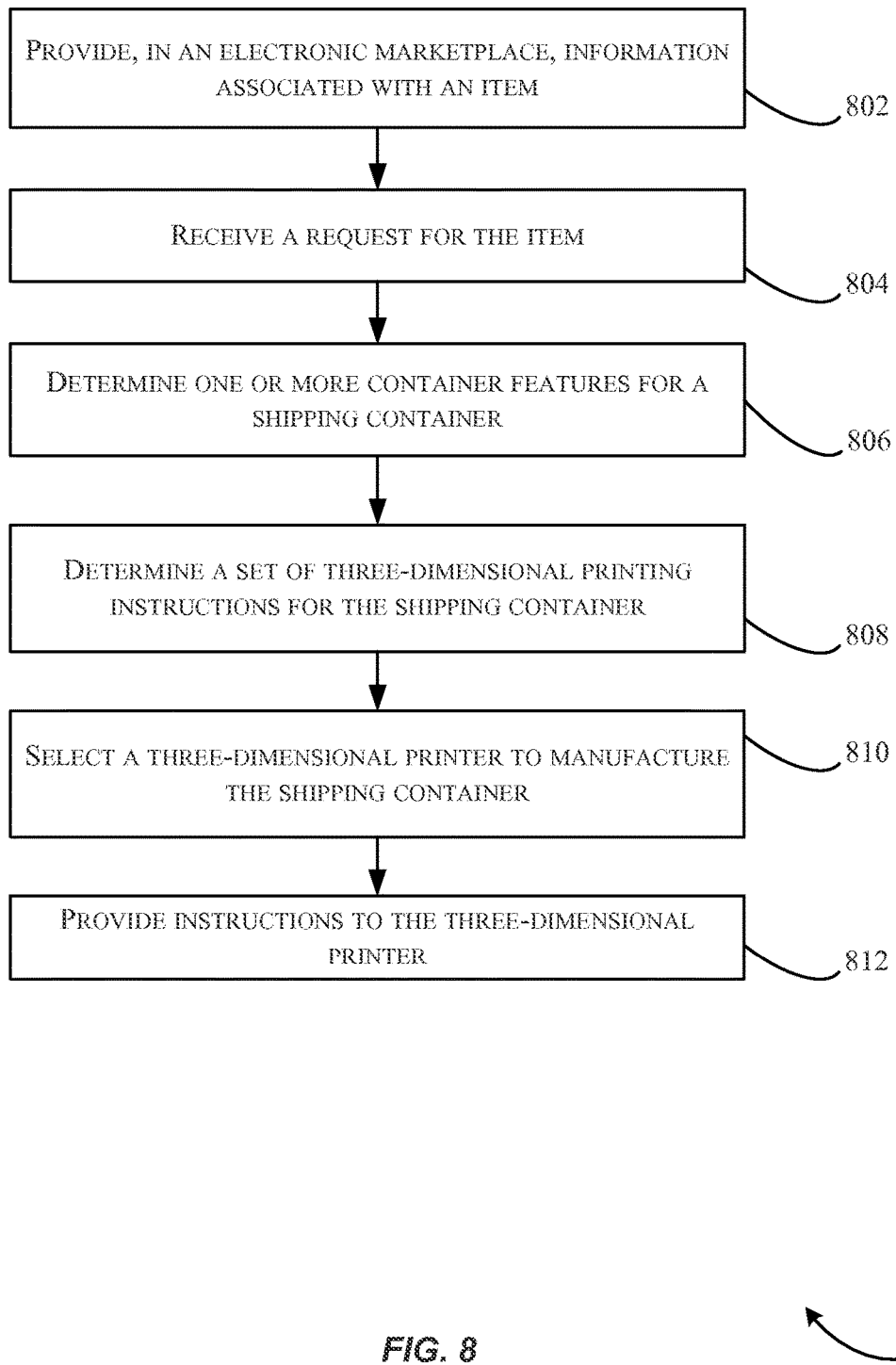
FIG. 8 is a flowchart illustrating a method for creating a 3D shipping container, in accordance with at least one embodiment.

FIG. 8 is a flowchart illustrating a method 800 for creating a 3D shipping container, in accordance with at least one embodiment. Some or all of the method 800 (or any other processes described herein, or variations and/or combinations thereof) may be embodied in one of more software programs that execute on one or more computer systems, such as 3D shipping container engine 402 and service provider computers 436.

The method 800 may begin at block 802, where information associated with an item is provided in an electronic marketplace (e.g., by service provider computers 436 of FIG. 4). In at least one example, a user may use electronic devices 434 to navigate to a network page of the electronic marketplace (e.g., a detail page related to an item offered for consumption). The user may further utilize the electronic devices 434 to purchase the item. At block 804, service provider computers 436 may generate and transmit a request for the item to 3D shipping container engine 402 via application programming interface 418. In some cases, the user may interact directly with the graphical user interface 416 in order to transmit order data. In at least one example, the item requested may not exist at the time of request. For example, the item may be printed at substantially the same time as the shipping container or at another suitable time. After an order for an item is received a request can be routed to the appropriate warehouse and to a 3D shipping container engine 402.

At block 806, one or more container features for a shipping container may be determined. For example, order manager 424, upon receipt of the request for the item at block 804, may retrieve item information for the item(s) requested. Such item information may include one or more pre-determined container features that should be utilized when shipping the item. Such information may be transmitted to manufacturing instructions engine 420. Alternatively, order manager may transmit the order information and manufacturing instructions engine 420 may retrieve item information from inventory data store 412. Manufacturing instructions engine 420 may determine a set of instructions for generating a 3D shipping container for the ordered item. For example, the manufacturing instructions engine 420 may use item information such as physical characteristics of the item (e.g., a 3D model of the item or information such as the item's size, weight, etc.) to build a 3D model of a shipping container. The engine can determine the material used to create the container (so to ensure that the container is strong enough to transport the item), container features to add to the container (e.g., to customize the container, add protrusions or cavities, etc.). For example, the manufacturing instructions engine 420 may determine one or more container features based on analyzing the information associated with the item(s). For example, manufacturing instructions engine 420 may, upon determining that the item is a "fragile" item (e.g., that the item has been marked as fragile by an administrator in a database or the item has been broken over a threshold number of times during shipment), may include three-dimensional instructions for manufacturing a shock absorption mechanism as discussed in FIG. 6. Additionally, or alternatively, manufacturing instructions engine 402 may analyze any number of factors (e.g., past order history for the item, return history of the item, item information, weather information related to a shipping destination for the item, routing information related to the shipping destination for the item) when determining the one or more container features for the shipping container. In one non-limiting example, the shipping container material and thickness may be determined based on the weight of the item to be shipped).

In accordance with at least one embodiment, manufacturing instructions engine 420 may interact with order data store 414 in order to analyze past order history in order to determine one or more container features. As a non-limiting example, manufacturing instructions engine 420 may determine that past orders of a particular item have been returned a particular number of times where the return was due to the item being damaged in transit. Given such information, manufacturing instructions engine 420 may include in the three-dimensional instructions for manufacturing the shipping container, instructions for manufacturing a three-dimensional shock absorption mechanism as discussed in FIG. 6.

In another example, one or more container features may be determined by user preference. In such an example, a user may have previously indicated that he wishes to include moisture indicators containers housing items of a particular type, bought from a particular merchant, or for items of a particular item type. This user's preference may be received by user preference manager 422 and stored in user preferences data store 408. Manufacturing instructions engine 420 may utilize such preference information when determining one or more container features for a shipping container.

At block 808, a set of three-dimensional printing instructions may be determined (e.g., by manufacturing instructions engine 420). As described above, item information, user preference information, transport container information, past order history, third-party provided design information and the like may be utilized by manufacturing instructions engine 420 when determining the set of three-dimensional printing instructions. Once determined, these instructions may be transmitted to manufacturing coordination manager 430.

As part of a process for determining a set of three-dimensional printing instructions, shipping container specifications may be determined by manufacturing instructions engine 420. Shipping container specification information may be combined with the one or more container features determined at block 806 to generate a shipping container model. 3D shipping container engine 402 may receive an order for the item (e.g., via application programming interface 418, graphical user interface 416, and order manager 424.) Upon receipt of the order, item information may be retrieved (e.g., by order manager 424 from inventory data store 412). A 3D model of the item may be retrieved from the item information, or alternatively, a 3D model may be generated from item information. In at least one example, the user may select the dimensions of the shipping container using graphical user interface 416 (e.g., by drawing a box around the item indicative of the shipping container size desired). Alternatively, shipping container dimensions may be calculated by, for example, manufacturing instructions engine 420 by utilizing item information and ascertaining a bounding box that would constitute the smallest possible shipping container dimensions capable of containing the item and any cushioning materials, such as bubble wrap or the like that will go into the shipping container. In addition, the manufacturing instructions engine 420 can determine the type or amount of material used to build the shipping container. For example, the weight of the contents of a shipping container can be mapped to a combination of material type and thickness in a database. After a 3D model of the shipping container is generated, features are set, etc., the manufacturing instructions engine 420 can build a set of 3D printer instructions to construct the shipping container. In at least one example, a number of possible shipping containers may be calculated in a similar manner by manufacturing instructions engine 420. These shipping containers may be ranked according to various factors (e.g., cost to produce, cost to ship, time to manufacture) and a number of the possible shipping containers may be presented to the user for selection.

In at least one example, as part of a process for determining shipping container specifications, manufacturing instructions engine 420 may determine a number of candidate shipping containers to present to a user (e.g., via display manager 428). In one non-limiting example, a number of standard shipping containers may be determined and presented to the user for selection. In at least one example, a number of possible shipping containers may be calculated utilizing a simulation model and may provide an approximate simulation of certain physical aspects or systems of an item, such as rigid body dynamics, soft body dynamics, fluid dynamics, and material dynamics. For example, the simulation model may utilize a 3D model of the item to generate simulation data related to how the item may react to various environments (e.g., sub-zero weather) and shipping events (e.g., a bouncing delivery truck) if shipped within a particular shipping container having particular shipping container features and specification. In at least one example, rather than generating such simulation data, manufacturing instructions engine 420 may receive testing data from a remote source, the testing data being related to how the item may react to various environments and shipping events. The testing data may have been produced by a testing group (e.g., a group of manufacturing engineers) responsible for conducting physical tests using various shipping containers and various items in order to determine whether a shipping container is sufficient to ship a particular item (e.g., that more likely than not the item, shipped with the shipping container, will arrive at its destination intact).

At block 810, a three-dimensional printer is selected to manufacture the shipping container. In at least one example, manufacturing coordination manager 430 may be utilized to select a particular 3D printer. Inventory data store 412, which may store information regarding available 3D printers, may be consulted in order to determine, for example, a location of the requested item, and a location of an available 3D printer (e.g., the nearest available 3D printer). Manufacturing coordination manager 430 may additionally take into account each printer's manufacturing capabilities when selecting a particular 3D printer. For example, an aluminum shipping container may be required, but only one 3D printer in the warehouse may be capable of printing that shipping container either due to workload or limited printing capabilities.

At block 812, the determined instructions from block 808 may be provided to the selected 3D printer.

Figure 9:
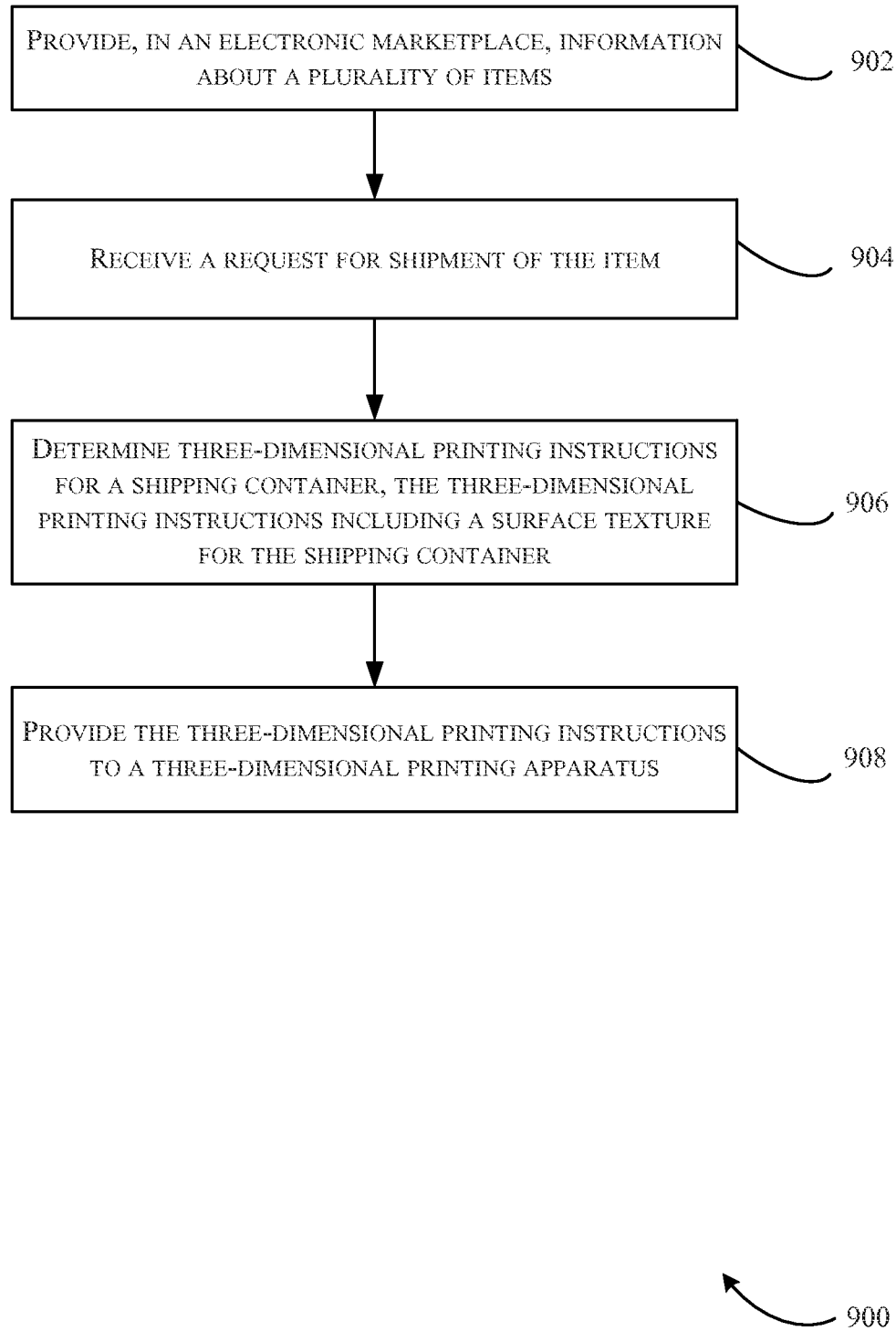
FIG. 9 is a flowchart illustrating another method for providing 3D printing instructions for a shipping container, in accordance with at least one further embodiment.

FIG. 9 is a flowchart illustrating another method 900 for providing 3D printing instructions for a shipping container, in accordance with at least one further embodiment. The method 900 may begin at block 902, where information associated with a plurality of items is provided in an electronic marketplace (e.g., by service provider computers 436 of FIG. 4). As described above, a user may navigate to a network page and utilize an electronic device to purchase a plurality of items. At block 904, 3D shipping container engine 102 may receive a request for an item via application programming interface 418. In some cases, the user may interact directly with the graphical user interface 416 to enable 3D shipping container engine 102.

At block 906, three-dimensional printing instructions may be determined for the shipping container. For example, manufacturing instructions engine 420 may interact with order data store 414 in order to analyze past order history for the requested item. For example, manufacturing instructions engine 420 may determine that the requested item has been returned over a threshold number of times due to being damaged while in transit. Thus, the manufacturing instructions engine 420 may determine that the shipping container include a surface texture and include such instructions in the three-dimensional printing instructions for the shipping container.

At block 908, the determined instructions from block 906 may be provided to a 3D printer.

Figure 10:
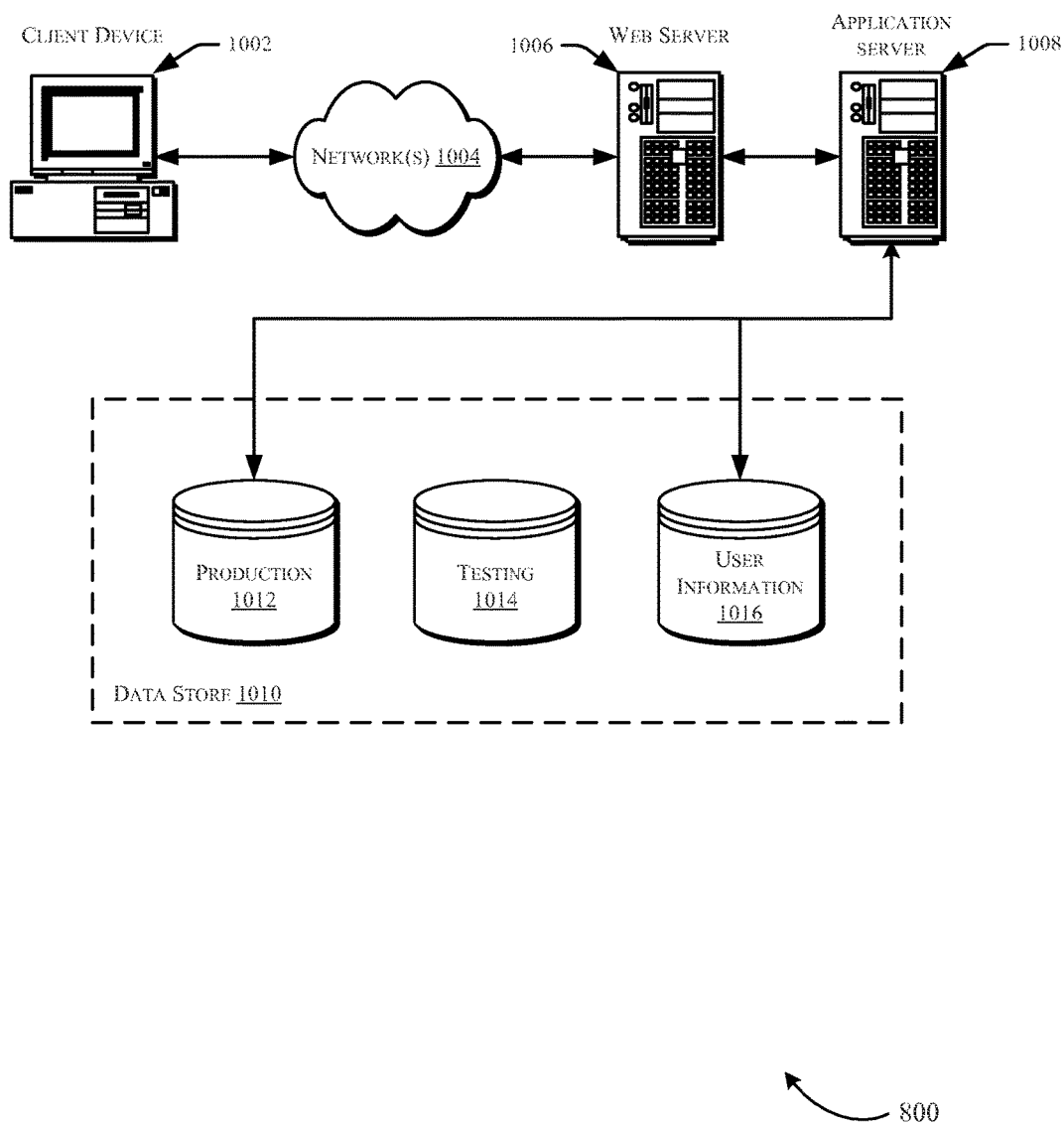
FIG. 10 is a schematic diagram illustrating an example environment for implementing aspects in accordance with at least one embodiment described herein.

FIG. 10 is a schematic diagram illustrating an example environment 1000 for implementing aspects in accordance with at least one embodiment of the 3D shipping container engine 102 described herein. As will be appreciated, although a Web-based environment is used for purposes of explanation, different environments may be used, as appropriate, to implement various embodiments. The environment includes an electronic client device 1002, which can include any appropriate device operable to send and receive requests, messages, or information over an appropriate network 1004 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 1006 for receiving requests and serving content in response thereto, although for other networks an alternative device serving a similar purpose could be used as would be apparent to one of ordinary skill in the art.

The illustrative environment includes at least one application server 1008 and a data store 1010. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio and/or video to be transferred to the user, which may be served to the user by the Web server in the form of Hyper Text Markup Language ("HTML"), Extensible Markup Language ("XML"), JavaScript Object Notation ("JSON") or another appropriate structured language in this example. The handling of all requests and responses, as well as the delivery of content between the electronic client device 1002 and the application server 1008, can be handled by the Web server. It should be understood that the Web and application servers are not required and are merely example components, as structured code discussed herein can be executed on any appropriate device or host machine as discussed elsewhere herein.

The data store 1010 can include several separate data tables, databases or other data storage mechanisms and media for storing data relating to a particular aspect. For example, the data store illustrated includes mechanisms for storing production data 1012 and user information 1016, which can be used to serve content for the production side. The data store also is shown to include a mechanism for storing log data 1014, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 1010. The data store 1010 is operable, through logic associated therewith, to receive instructions from the application server 808 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the electronic client device 1002. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 4. Thus, the depiction of the environment 1000 in FIG. 10 should be taken as being illustrative in nature and not limiting to the scope of the disclosure.

The various embodiments further can be implemented in a wide variety of operating environments, which in some cases can include one or more user computers, computing devices or processing devices that can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response requests from user devices, such as by executing one or more Web applications that may be implemented as one or more scripts or programs written in any programming language, such as Java*, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

In the description above, various embodiments of the present disclosure have been described. For purposes of explanation, specific configurations and details have been set forth in order to provide a thorough understanding of the embodiments. However, it will also be apparent to one skilled in the art that the embodiments may be practiced without the specific details. Furthermore, well-known features may have been omitted or simplified in order not to obscure the embodiment being described.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

Some or all of the process described above may be performed under the control of one or more computer systems configured with specific computer-executable instructions and may be implemented as code (e.g., executable instructions, one or more computer programs or one or more applications) executing collectively on one or more processors, by hardware or combinations thereof. The code may be stored on a non-transitory computer-readable storage medium, for example, in the form of a computer program including a plurality of instructions executable by one or more processors. The computer-readable storage medium may be non-transitory.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z for each to be present.

Preferred embodiments of this disclosure are described herein, including the best mode known to the inventors for carrying out the invention. Variations of those preferred embodiments may become apparent to those of ordinary skill in the art upon reading the foregoing description. The inventors expect skilled artisans to employ such variations as appropriate and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method, comprising:
providing, in an electronic marketplace, information associated with an item;
obtaining, from a user, a request for the item;
obtaining an order history associated with the item;
determining, utilizing the order history, that the item has been returned over a threshold number of times due to the item being damaged in transit;
determining a container specification for a shipping container based at least on physical characteristics of the item, one or more container features, and the determination that the item has been returned over the threshold number of times, wherein the container specification comprises an internal shock absorption mechanism based at least in part on the determination that the item has been returned over the threshold number of times;
determining a set of three-dimensional printing instructions based at least on the container specification;
selecting a three-dimensional printer to manufacture the shipping container based at least in part on the set of three-dimensional printing instructions for the shipping container;
providing instructions to the selected three-dimensional printer, wherein the instructions instruct the selected three-dimensional printer to manufacture the shipping container based at least in part on the determined set of three-dimensional printing instructions; and
causing the selected three-dimensional printer to manufacture the shipping container based at least in part on the determined set of three-dimensional printing instructions.

2. The computer-implemented method of claim 1, wherein the one or more container features include at least one of a container material, a container thickness, a temperature indicator, a moisture indicator, a corrosive indicator, an accelerometer, a container-sealing mechanism, a radio frequency identification tag, or a transport mechanism.

3. The computer-implemented method of claim 1, wherein the set of three-dimensional printing instructions for the shipping container are further based on a three-dimensional model of the item.

4. The computer-implemented method of claim 3, wherein providing the set of three-dimensional printing instructions to the three-dimensional printer causes the three-dimensional printer to manufacture the shipping container to include a surface texture on a portion of the shipping container.

5. A system, comprising:
a processor; and
a memory storing computer-executable instructions that, when executed with the processor, cause the system to at least:
obtain item information for one or more items;
obtain an order history associated with the one or more items;
determine, utilizing the order history, that an item of the one or more items has been returned over a threshold number of times due to the item being damaged in transit;
determine a container specification for a container to store the one or more items based at least on the item information and the determination that the item has been returned over the threshold number of times, wherein the container specification for the container comprises an internal shock absorption mechanism based at least in part on the determination that the item has been returned over the threshold number of times;
provide three-dimensional additive manufacturing instructions for the container based at least in part on the container specification; and
cause the container to be manufactured based at least in part on the container specification.

6. The system of claim 5, wherein the item information includes at least one of a weight, a height, a width, a depth, a composition material, an indication of fragility, an indication of corrosive material, an indication of hazardous material, a temperature range, a humidity range, a quantity, a fluid amount, or a geometric shape.

7. The system of claim 6, having further computer-executable instructions that, when executed with the processor, cause the system to at least:
determine a material with which to manufacture the container based at least in part on the item information.

8. The system of claim 5, having further computer-executable instructions that, when executed with the processor, cause the system to at least:
determine a three-dimensional additive manufacturing apparatus to manufacture the container based at least in part on the set of three-dimensional additive manufacturing instructions for the container, wherein providing the three-dimensional additive manufacturing instructions to the three-dimensional additive manufacturing apparatus causes the three-dimensional additive manufacturing apparatus to manufacture the container around the one or more items according to the three-dimensional additive manufacturing instructions.

9. The system of claim 5, wherein the container specification includes information related to a corrugated area of the container.

10. The system of claim 5, wherein the three-dimensional additive manufacturing instructions include additive manufacturing instructions for a plurality of container pieces.

11. The system of claim 10, wherein the three-dimensional manufacturing instructions are provided to a three-dimensional printer, and wherein provided the three-dimensional manufacturing instructions to the three-dimensional printer causes the three-dimensional printer to manufacture the container, the container comprising the plurality of container pieces.

12. The system of claim 5, wherein the container specification is determined further based at least in part on at least one of an environmental condition, an environmental prediction, or routing instruction related to a shipping destination of the container.

13. The system of claim 5, wherein the container comprises a surface texture, and wherein the surface texture includes a connector that protrudes and corresponds to an indented area of an additional container.

14. A non-transitory computer-readable storage medium having stored thereon computer-executable instructions that, when executed with a processor, cause a computer system to perform operations comprising:
obtaining a request for an item;
obtaining an order history associated with the item;
determining, utilizing the order history, that the item has been returned over a threshold number of times due to the item being damaged in transit;
determining a container specification for the container based at least on physical characteristics of the item and the determination that the item has been returned over the threshold number of times, wherein the container specification for the container comprises an internal shock absorption mechanism based at least in part on the determination that the item has been returned over the threshold number of times;
- determining three-dimensional printing instructions for a shipping container based at least in part on the container specification;
- providing the three-dimensional printing instructions to a three-dimensional printing apparatus; and
- causing the shipping container to be manufactured by the three-dimensional printing apparatus based at least on the three-dimensional printing instructions.

15. The non-transitory computer-readable storage medium of claim 14, wherein the shipping container comprises a fully sealed structure that includes an opening mechanism.

16. The non-transitory computer-readable storage medium of claim 14, wherein the shipping container includes a printed internal shock absorption mechanism.

17. The non-transitory computer-readable storage medium of claim 15, wherein the opening mechanism relates to the shipping container including a plurality of materials of different tensile strengths.

18. The non-transitory computer-readable storage medium of claim 14, if wherein the operations further comprise:
- receiving an additional container specification from a third-party provider of the item, wherein the three-dimensional printing instructions for the shipping container are further based on the additional container specification.

19. The non-transitory computer-readable storage medium of claim 14, wherein the operations further comprise:
- determining an optimal packing configuration for a transport container based at least in part on a plurality of items to be transported, wherein the three-dimensional printing instructions for the shipping container are further based at least in part on the optimal packing configuration and dimensions of the transport container.

\* \* \* \* \*

UNITED STATES PATENT AND TRADEMARK OFFICE
CERTIFICATE OF CORRECTION

PATENT NO. : 9,962,921 B1  
APPLICATION NO. : 14/574241  
DATED : May 8, 2018  
INVENTOR(S) : Derek Avery Lyon Page 1 of 1

It is certified that error appears in the above-identified patent and that said Letters Patent is hereby corrected as shown below:

On the Title Page

Item (57), Line 5:
Delete: "Based the container specifications, 3D additive manufacturing instructions may be provided for the container."
Insert: --Based on the container specifications, 3D additive manufacturing instructions may be provided for the container.--

In the Claims

Column 24, Line 42, Claim 11:
Delete: "dimensional printer, and wherein provided the three-dimensional"
Insert: --dimensional printer, and wherein providing the three-dimensional--

Signed and Sealed this  
Sixth Day of November, 2018

Andrei Iancu  
*Director of the United States Patent and Trademark Office*